(12) United States Patent
Chang et al.

(10) Patent No.: US 6,381,730 B1
(45) Date of Patent: Apr. 30, 2002

(54) METHOD AND SYSTEM FOR EXTRACTION OF PARASITIC INTERCONNECT IMPEDANCE INCLUDING INDUCTANCE

(75) Inventors: Keh-Jeng Chang, San Jose; Li-Fu Chang, Santa Clara; Robert G. Mathews, Los Altos; Martin G. Walker, Woodside, all of CA (US)

(73) Assignee: Sequence Design, Inc., Santa Clara, CA (US)

( * ) Notice: Subject to any disclaimer, the term of this patent is extended or adjusted under 35 U.S.C. 154(b) by 0 days.

(21) Appl. No.: 09/350,966

(22) Filed: Jul. 9, 1999

(51) Int. Cl.$^7$ .............................................. G06F 17/50
(52) U.S. Cl. .............................................. 716/5; 716/4
(58) Field of Search .......................................... 716/5, 4

(56) References Cited

U.S. PATENT DOCUMENTS

| | | | | |
|---|---|---|---|---|
| 4,359,682 A | * | 11/1982 | Winslow | 324/56 B |
| 5,610,833 A | * | 3/1997 | Chang et al. | 364/491 |
| 5,901,063 A | | 5/1999 | Chang et al. | 364/488 |
| 5,923,523 A | * | 7/1999 | Herbert | 361/306.1 |
| 6,128,768 A | * | 10/2000 | Ho | 716/5 |
| 6,175,947 B1 | * | 1/2001 | Ponnapalli et al. | 716/5 |
| 6,237,126 B1 | * | 5/2001 | Bonitz | 716/4 |

OTHER PUBLICATIONS

Lee et al, "A Multilevel Parasitic Interconnect Capacitance Modeling and Extraction for Reliable VLSI On–Chip Delay Evaluation," Apr. 1998, pp. 657–661.*

Beker et al, "Extraction of Parasitic Circuit Elements in a Pebb for Application in the Virtual Test Bed," IEEE, 1997, pp. 1217–1221.*

M.K.Iyer et al, "Electro Magnetic Simulation and Measurement of Electrical Parasitics in High Density QFP Packages," IEEE, 1997, pp. 313–319.*

Kleveland et al, "Line Inductance Extraction and Modeling in a Real Chip with Power Grid," IEEE, Dec. 1999, pp. 37.3.1–37.3.4.*

Columbus™ Parasitic Extractor Brochure, Frequency Technology, Inc. (1998).

Massoud, Y. et al., "Layout Techniques for Minimizing On–Chip Interconnect Self Inductance", Proceedings 1998 Design Automation Conference (1998), pp. 566–571.

Chapter 4, "Inductance Calculation with R13" from Raphael Interconnect Analysis Program Version 3.3 Reference Manual, Technology Modeling Associates, Inc. (1996).

Sylvester, D., "Interconnect's Role in Deep Submicron", EE219 Course Materials, pp. 1, 8–10, 13 and 15–16 (1998).

* cited by examiner

*Primary Examiner*—Vuthe Siek
(74) *Attorney, Agent, or Firm*—Skjerven Morrill MacPherson LLp; Carmen C. Cook

(57) ABSTRACT

A novel parasitic extraction system includes an interconnect primitive library that has a parameterized inductance function for at least one conducting layer of the integrated circuit. A parasitic extractor analyzes structures within a selected distance of a selected conductor within the integrated circuit and determines parasitic inductance values for the selected conductor using the parameterized inductance function of the interconnect primitive library. Using this parasitic extraction system, parasitic impedances, including inductance, may be extracted for an integrated circuit layout, thus allowing more accurate modeling and timing analysis of the integrated circuit layout to be obtained.

32 Claims, 8 Drawing Sheets

METHOD AND SYSTEM FOR EXTRACTION OF PARASITIC INTERCONNECT IMPEDANCE INCLUDING INDUCTANCE

CROSS-REFERENCE TO RELATED PATENT

This application is related to U.S. Pat. No. 5,901,063.

TECHNICAL FIELD OF THE INVENTION

The present invention relates to automated tools for integrated circuit design. In particular, the present invention relates to modeling tools for calculating, measuring or predicting electrical characteristics of interconnect wiring in an integrated circuit.

BACKGROUND OF THE INVENTION

As integrated circuit ("IC") technology advances, integrated circuits are made at higher integration levels and to run at higher clock speeds. In fact, at submicron feature sizes, the signal delay associated with a signal path is dominated by metal interconnections, or "lines", which are used to connect the active devices. For example, in gate-arrays and other routed designs with relatively long lines, the signal delays due to wiring ("line delays") dominate signal delays between active devices at dimensions just below 1.0 micron. For more densely packed standard-cell designs, line delays dominate at below 0.6 micron. Unlike the signal delay in the active device itself, which is typically well-characterized, and can be read from a device library, a line delay depends on the structures in the vicinity of the line, and thus cannot be accurately modeled or calculated until after all circuit elements associated with the signal path of interest are placed and routed. Often, the accurate modeling of parasitic effects (e.g., parasitic capacitances) associated with these lines is critical to a successful integrated circuit design.

However, accurate modeling of parasitic impedances of lines is a complex problem, requiring extensive knowledge in the diverse areas of device physics, process technology and electromagnetic field theory. Further, to be of practical value, an accurate model of parasitic impedances must be made both readily available to the integrated circuit designer in his/her normal course of work, and easily incorporated in the integrated circuit under design.

The tasks ("design methodology") of an integrated circuit designer can be summarized by the design flow chart 100 shown in FIG. 1. As shown in FIG. 1, at step 101, the designer uses a high level hardware description language (e.g. Verilog or VHDL) to specify the functional and logic designs of the integrated circuit. Then, at step 102, the logic circuit is synthesized to a logic gate level circuit description, using an automatic logic synthesis tool. Typically, at the next step (i.e., step 103), a preliminary timing analysis on the logic gate level circuit is performed. Upon completing various verification steps (not shown) to ascertain the correctness of the logic gate level circuit and satisfying all timing constraints at the gross level, the physical design step (i.e. step 104) is carried out.

During physical design step 104, which is illustrated in further detail by the flowchart of FIG. 2, the logic gate level circuit description of step 102 is provided to a layout design system to be "placed" and "routed" (step 201). Placing is the process by which the logic elements of the logic gate level circuit description are realized in the circuit elements of a physical implementation. Routing is the process by which lines interconnecting the circuit elements of the physical implementation are created. At step 202, estimates of the parasitic impedances of lines in the physical implementation are made ("extracted") to form an interconnect delay model. The estimated parasitic impedances are then used, in step 203, to calculate signal delays resulting from these parasitic impedances. At step 204, a detailed timing analysis is then performed to verify that timing requirements are met in the physical implementation. If timing requirements are not met, the integrated circuit designer must return to step 201, i.e., to the layout design step, to make corrective modifications to the layout design. In fact, in some instances, the circuit designer may have to return to step 102, where the logic circuit is redesigned such that a circuit implementation meeting timing requirements may be re-synthesized. Steps 202–204 are then repeated as necessary. In designing a high-speed logic circuit, steps 201–204 are typically reiterated many times.

When the design is deemed to have met its timing requirements, the final verification step (i.e. step 105) is performed. In the final verification step, the layout design is checked for compliance with design rules, and an even more extensive timing analysis is also performed.

In the prior art, as the physical circuit elements are interconnected, most place and route systems generate estimates of line parasitic impedances to be used in subsequent timing simulations. These estimates of parasitic impedances are typically based on a simplistic model which often takes into account only the dimensions of individual lines. The parasitic impedances due to the surrounding structures are compensated by a conservative "guard band". However, as integrated circuits go to successively higher levels of integration (i.e., smaller sizes and larger numbers of devices per chip) and use more layers of conductors, the simplistic model breaks down. In fact, the simplistic model is insufficient to allow accurate analysis of sub-micron designs, especially when estimating parasitic impedances in "critical" nets of the integrated circuit.

For an accurate analysis of parasitic impedances, Poisson's equation and Maxwell's equations can be solved for the space of interest using a 3-dimensional field solver. However, because both the computation and the input parameters are highly complex, 3-dimensional field solvers are difficult to set up, require significant amount of computational power, and their results are difficult to use. Typically, to achieve an accuracy that justifies the effort, values of relevant physical parameters of a fabrication process contemplated for implementing the design are required as input data to the 3-dimensional field solver. In addition, because the computation is so complex even for the analysis of a small portion of the integrated circuit, practical solutions require the surrounding lines of a space of interest be broken up by the user into small segments and be analyzed separately. The user must then collect and process the separate solutions of each analysis to be used in a subsequent delay calculation. As a result of its complexity, the 3-dimensional field solver approach cannot be extensively used with an existing design methodology, such as that illustrated in FIGS. 1 and 2.

SUMMARY OF THE INVENTION

Therefore, a need has arisen for a parasitic impedance calculation system and method that addresses the disadvantages and deficiencies of the prior art. In particular, a need has arisen for a method and system for extracting parasitic interconnect impedances, including inductance.

Accordingly, a novel parasitic extraction system is disclosed. In one embodiment, the parasitic extraction system includes an interconnect primitive library that has a parameterized inductance function for at least one conducting layer of the integrated circuit. A parasitic extractor analyzes structures within a selected distance of a selected conductor within the integrated circuit and determines parasitic inductance values for the selected conductor using the parameterized inductance function of the interconnect primitive library.

In another aspect of the present invention, a method for analyzing signal timing in a circuit is disclosed. The method includes receiving a description of a layout of the circuit, receiving an identification of a conductor to be analyzed in the circuit, tracing the conductor to be analyzed using the description of the layout of the circuit, determining parasitic impedance values including an inductance value for the conductor using an interconnect primitive library including a parameterized inductance function, creating a circuit description for the conductor using the parasitic impedance values, and performing a circuit timing simulation using the circuit description for the conductor.

An advantage of the present invention is that parasitic impedances, including inductance, may be extracted for an integrated circuit layout. Another advantage of the present invention is that more accurate modeling and timing analysis of the integrated circuit layout may be obtained.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 3 through 12 of the drawings. Like numerals are used for like and corresponding parts of the various drawings.

The present invention provides a comprehensive system for generating accurate RLC models for interconnect lines. These RLC models can then be used to calculate line signal delays with the requisite accuracy needed to analyze submicron designs, without requiring the use of a complex 3-dimensional field solver on the interconnect lines.

Figure 1:
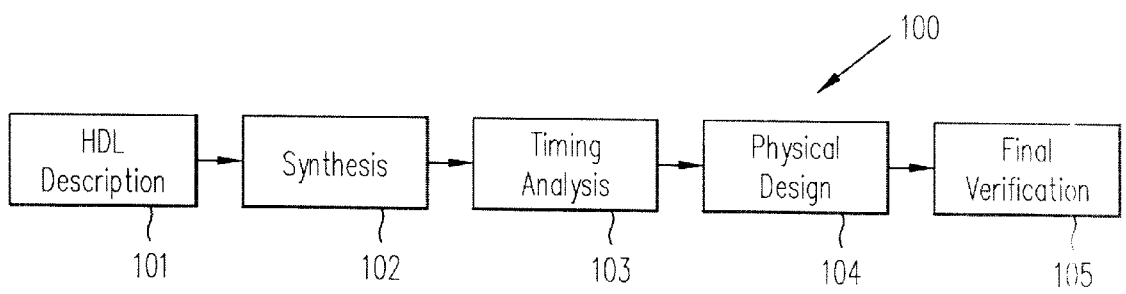
FIG. 1 is a flow chart 100 showing the tasks of an integrated circuit designer.
Figure 2:
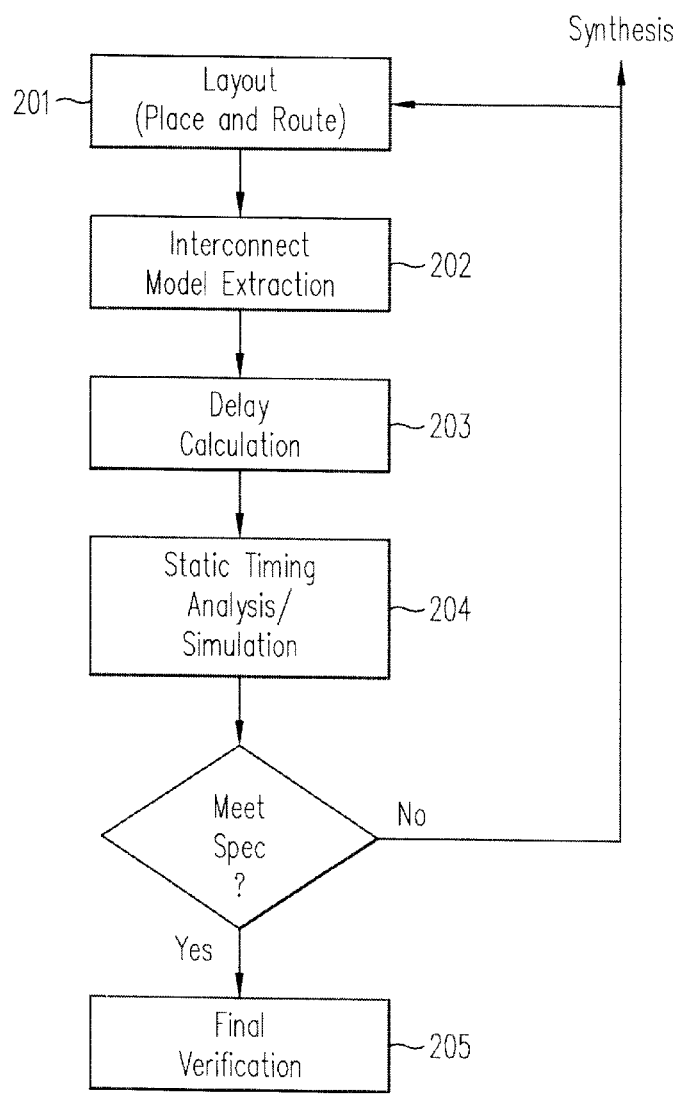
FIG. 2 is a flow chart further illustrating the physical design step 104 of FIG. 1.
Figure 3:
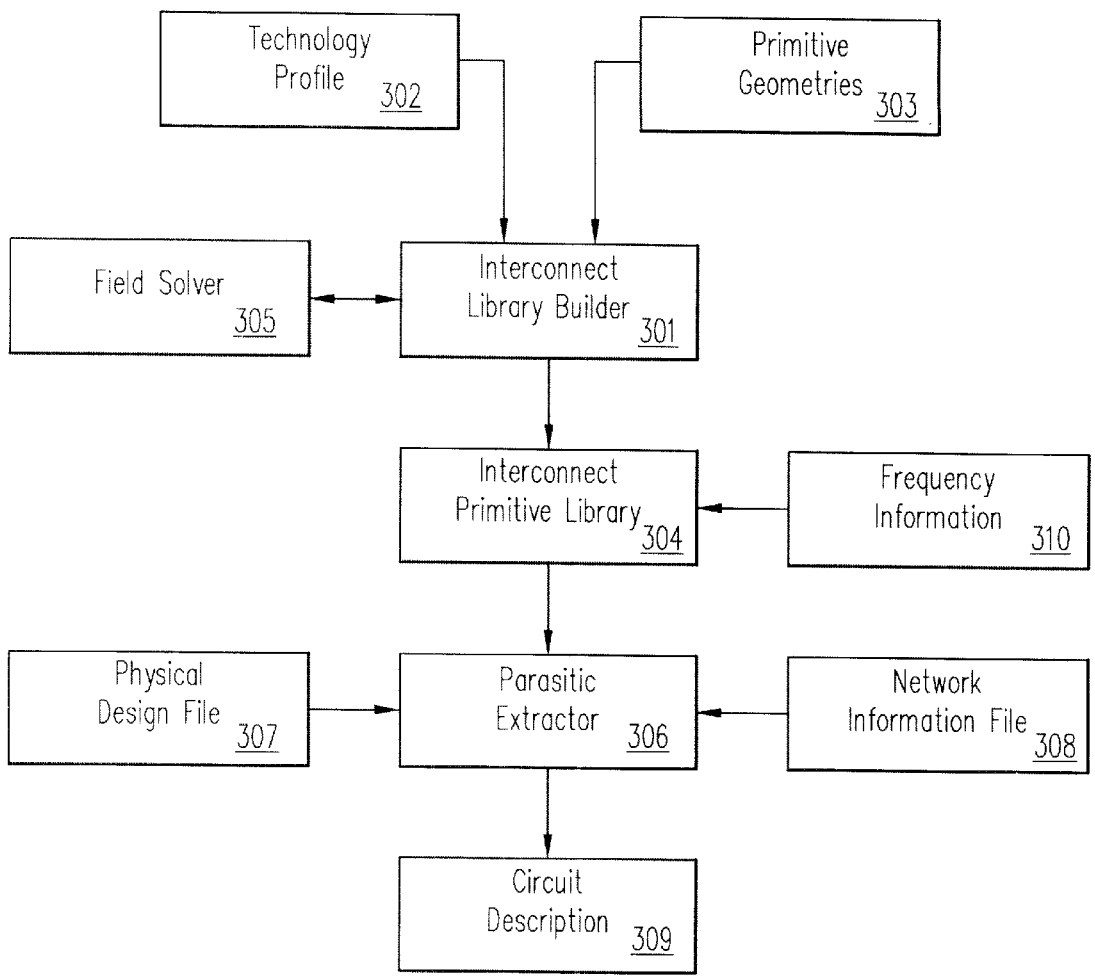
FIG. 3 is a block diagram illustrating the operation of an interconnect library builder and a parasitic extractor in an embodiment of the present invention.

Referring to FIG. 3, a block diagram illustrating the operation of an interconnect library builder 301 and a parasitic extractor 306 is shown. In accordance with one aspect of the present invention, interconnect library builder 301 creates an interconnect primitive library 304 for use by parasitic extractor 306 in extracting parasitic resistance, capacitance and inductance from an integrated circuit layout.

To create interconnect primitive library 304, interconnect library builder 301 uses a technology profile 302 which contains process data for describing the material and electrical properties of conductor and insulator layers fabricated in a given integrated circuit fabrication process. Technology profile 302 is specific to the fabrication process used for the integrated circuit to be analyzed. The data in technology profile 302 is typically supplied by the manufacturing facility ("fab"), having been extracted from various tests and measurements actually conducted in the fab.

Interconnect library builder 301 combines the process data from technology profile 302 with a database of interconnect primitive geometries 303, which represent basic components of interconnect structures into which any interconnect line structure can be broken down. For a given fabrication process, the parasitic impedances associated with some interconnect primitives can be extracted from one or more test structures created using the specified fabrication process. However, more typically the parasitic impedances associated with each interconnect primitive are calculated by a field solver 305 using the process data of technology profile 302. Examples of suitable field solvers for the calculation of capacitance include "Raphael," which can be obtained from Avant! Corporation of Fremont, Calif. and "QuickCAP," which can be obtained from Random Logic Corporation of Richmond, Va. Another field solver which may be used to calculate inductance values is "FastHenry" available from the Massachusetts Institute of Technology in Cambridge, Mass.

Since the parasitic inductance of a circuit will depend on the operating frequency of the circuit, interconnect library builder 301 also receives frequency information 310, either directly from the user or in connection with technology profile 302. Frequency information 310 may be a single frequency representative of the operating frequency of the circuit, or a range of frequencies within which the circuit is expected to operate (e.g. 100 MHz to 2 GHz). In the latter case, interconnect library builder 301 calculates inductance values at various selected frequencies within the frequency range (e.g. every 100 MHz). These inductance values allow later interpolation or extrapolation to derive an inductance value for a particular operating frequency, as will be described more fully below.

The impedance values reported by the field solver(s) 305 are stored in an interconnect primitive library 304. After the requisite number of field solver runs, which may number in the tens of thousands for each process, the impedance values reported by the field solvers are represented in interconnect primitive library 304 by a set of data tables, which constitute a set of 'parameterized' curves for each interconnect primitive. These parameterized curves can be scaled and interpolated to predict the impedance of an interconnect structure which is mapped into the interconnect primitive, with a minimal loss of accuracy.

Interconnect primitive library 304 is used as input by parasitic extractor 306. Parasitic extractor 306 also uses a physical design file 307, which sets forth the layout of the integrated circuit in question, and a network information file 308, which identifies the specific conductor to be analyzed, as input. Parasitic extractor 306 may also receive as input the actual operating frequency of the circuit specified by physical design file 307, either directly from the user or a part of physical design file 307.

As described below, actual interconnect structures from physical design file 307 are decomposed and mapped into the interconnect primitives of interconnect primitive library 304. The interconnect primitives and their associated impedances in interconnect primitive library 304 are used to estimate the parasitic impedances of the decomposed interconnect structures. The results are used to create an RLC circuit description 309. This process will be described more fully below. Other primitives with more complex arrangements of conductors having other metals running in the same direction or in directions perpendicular to conductors 1–5 may also be used and will of course make interconnect primitive library 304 more comprehensive and powerful, and the resulting inductance extraction more accurate.

Typically, the operation of interconnect library builder 301 is very slow compared to the operation of parasitic extractor 306. This is due to the repeated use of computation-intensive field solver(s) 305 by interconnect library builder 301. Thus, interconnect library builder 301 is typically run "off-line," or in advance, to create interconnect primitive library 304. Furthermore, interconnect primitive library 304 is process-dependent, meaning that it takes into account the fabrication process parameters set forth in technology profile 302, but design-independent, in the sense that physical design file 307, which sets forth the actual integrated circuit layout, is not taken into account in the creation of interconnect primitive library 304. Once interconnect primitive library 304 has been created, parasitic extractor 306 may be run a number of times to analyze different signal paths from physical design file 307, or to analyze a number of different circuit designs if necessary.

The contents of interconnect primitive library 304 and its creation by interconnect library builder 301 will now be described in detail. In the following description, the term "line being analyzed," sometimes abbreviated "LBA," is used to denote a conductor line or line segment for which parasitic impedance values are to be calculated.

For purposes of inductance calculation, interconnect library builder 301 sequentially selects one interconnect layer or metal layer at a time from the fabrication process specified in technology profile 302. A primitive geometry such as that shown in FIG. 10 is then used to create input for an inductance-capable field solver 305 to determine the inductance of a conductor in the selected metal layer.

Figure 10:
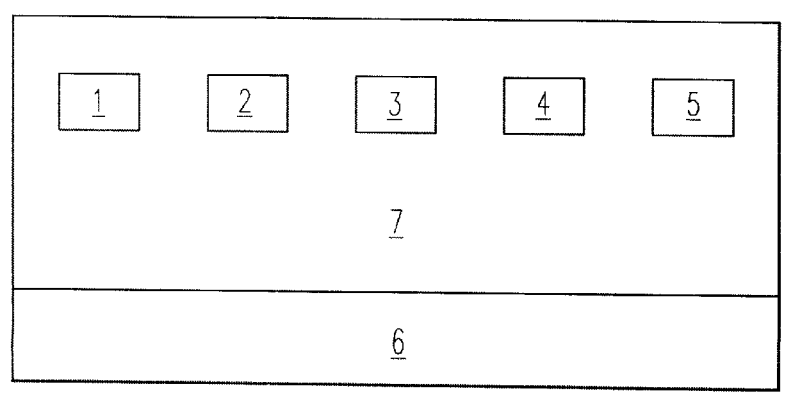
FIG. 10 is a cross section of a primitive used to calculate the inductance of a conductor.

In FIG. 10, a primitive 1000 includes five identical, parallel conductors 1–5 from the same metal layer, a substrate 6 and a dielectric material 7. Primitive 1000 may be used to calculate the inductance of a conductor in any metal layer specified in technology profile 302. Conductors 1–5 have the thickness and material properties set forth in technology profile 302 for the selected metal layer. The width and separation of conductors 1–5 are not specified in technology profile 302, and are therefore each initially selected to be at the lower end of a range of reasonable values as determined by interconnect library builder 301. Conductors 1–5 are separated from substrate 6 by the distance set forth in technology profile 302 for the selected metal layer. Dielectric material 7 has the dielectric properties set forth in technology profile 302 for the dielectric that surrounds the selected metal layer. Dielectric material 7 may therefore comprise several different layers of dielectric material, depending on the dielectric layers described in technology profile 302.

It should be noted that, for purposes of simplifying the inductance extraction process, primitive 1000 intentionally omits all conductors from all metal layers other than the selected metal layer, whether the other metal layers are above or below the selected metal layer. Primitive 1000 therefore represents in most cases a simplification of the actual interconnect geometry of the integrated circuit in question. During inductance extraction, one or more actual current return paths are compared with inductance primitives such as primitive 1000 to calculate inductance values for the integrated circuit in question, as will be described below. Interpolation and/or extrapolation may have to be used (as described below) to calculate these inductance values based on primitive 1000.

When interconnect library builder 301 has determined the various physical parameters of primitive 1000 as set forth above, these parameters are supplied to an inductance-capable field solver 305, along with a selected frequency for which inductance is to be calculated as previously described. Field solver 305 performs calculations using this input to generate a partial inductance matrix Lp as follows:

| $Lp_{11}$ | $Lp_{12}$ | $Lp_{13}$ | $Lp_{14}$ | $Lp_{15}$ | $Lp_{16}$ |
|---|---|---|---|---|---|
| $Lp_{21}$ | $Lp_{22}$ | $Lp_{23}$ | $Lp_{24}$ | $Lp_{25}$ | $Lp_{26}$ |
| $Lp_{31}$ | $Lp_{32}$ | $Lp_{33}$ | $Lp_{34}$ | $Lp_{35}$ | $Lp_{36}$ |
| $Lp_{41}$ | $Lp_{42}$ | $Lp_{43}$ | $Lp_{44}$ | $Lp_{45}$ | $Lp_{46}$ |
| $Lp_{51}$ | $Lp_{52}$ | $Lp_{53}$ | $Lp_{54}$ | $Lp_{55}$ | $Lp_{56}$ |
| $Lp_{61}$ | $Lp_{62}$ | $Lp_{63}$ | $Lp_{64}$ | $Lp_{65}$ | $Lp_{66}$ |

The elements of partial inductance matrix Lp may be represented by $Lp_{ij}$, in which the subscripts i and j each independently designate one of the conductors 1–5 or substrate 6 of primitive 1000. Thus, if i=j, then $Lp_{ij}$ represents the self partial inductance of one of the conductors 1–5 or substrate 6. If i≠j, then $Lp_{ij}$ represents the mutual partial inductance of two of the conductors 1–5, or of substrate 6 and one of the conductors.

It will be understood by those skilled in the art that inductance can only be meaningfully applied to a closed loop or circuit. Thus, the inductance which will be experienced by a signal on any conductor cannot be estimated without knowing the "return path" for current carried by that conductor. The "return path" refers to another conductor or conductors (including semiconductors) that can most easily carry the return current that results from current carried by the conductor in question. Thus, the concept of partial inductance, which may be used to calculate actual inductance once a conductor and return path are specified, is well known to those skilled in the use of inductance-capable field solvers.

From partial inductance matrix Lp, interconnect library builder 301 may calculate an inductance per unit length for a loop in which, for example, conductor 3 is the signal path in question and conductor 4 is the return path. In this example, the inductance is given by $$L = Lp_{33} + Lp_{44} - Lp_{34} - Lp_{43}. \qquad (1)$$

In one embodiment of the present invention, substrate 6 is always assumed to provide an additional return path for any conductor. Thus, the inductance per unit length for conductor 3 as the signal path in question is given by $$L=Lp_{33}+Lp_{44}-Lp_{34}-Lp_{43}+LP_{66}-LP_{36}-Lp_{63}. \quad (2)$$

In this manner, interconnect library builder 301 calculates the inductance per unit length (L) for a signal path in the selected metal layer, assuming that an adjacent conductor and the substrate both provide return paths for the current. This inductance value is then stored in an inductance table in interconnect primitive library 304. This inductance value is indexed in the inductance table according to (i) the selected metal layer; (ii) the conductor width assumed by interconnect library builder 301 for primitive 1000; (iii) the conductor spacing assumed by interconnect library builder 301 for primitive 1000; and (iv) the operating frequency assumed by interconnect library builder 301 in calculating the inductance, if a range of frequencies was originally supplied to interconnect library builder 301.

A similar set of calculations may be performed using the assumption that two conductors, such as conductors 2 and 4, provide return paths for conductor 3. The resulting inductance values, indexed by metal layer, conductor width and conductor spacing as previously described, may be stored in the same table with the inductance values previously calculated. In this example, the inductance values stored in interconnect primitive library are then further indexed by the number of (non-substrate) return paths assumed in each case (i.e. one or two).

Interconnect library builder 301 then repeats the above process for several different conductor widths and conductor spacings, in each case assuming that the conductors of primitive 1000 are identical in width and uniform in spacing. Interconnect library builder 301 thereby creates a parameterized inductance function in which the parameters or independent variables are the conductor width and the conductor spacing. Since the signal path and closest return path are assumed to be adjacent conductors, the parameters for the inductance function are in effect the conductor width and the distance to the closest return path.

It should be noted that primitive 1000 includes five conductors 1–5 from the metal layer in question. However, a larger or smaller primitive may be used, including a larger or smaller number of conductors, respectively. Thus, primitive 1000 or a smaller primitive (with, e.g., a width of 20 microns) may be a starting point for the calculations described above for each selected line width and conductor spacing. After an inductance has been calculated for this initial primitive size, a larger primitive size (e.g. 40 microns wide) may be used to recalculate the inductance value for each selected line width and conductor spacing. This process may be repeated, increasing the primitive size by, for example, 20 microns at each step, until a set of inductance values (referred to as $L_{i+1}$ herein for illustrative purposes) that differ from the immediately-preceding set of inductance values ($L_i$) by less than, for example, two percent is found. At this point, the width used to calculate that immediately-preceding set of inductance values ($L_i$) may be assumed as the largest necessary width for inductance calculation for the metal layer in question. Thus, the immediately-preceding set of inductance values ($L_i$) is stored in the inductance table in interconnect primitive library 304, along with a number indicating the width (or one-half of the width) of the primitive used to calculate those inductance values. The half-width of the primitive will be used later to set the "concern distance" for this metal layer, as will be described more fully below.

After completing the above-described process for one selected metal layer, interconnect library builder 301 repeats the process for each metal layer specified by technology profile 302. Thus, a parameterized inductance function is tabulated and stored in interconnect primitive library 304 for each metal layer in the integrated circuit to be analyzed.

Each of the inductance values calculated for interconnect primitive library 304 may be checked for "reasonableness" prior to being tabulated in interconnect primitive library 304. This check may be desirable due to the fact that different algorithms may be used during capacitance and inductance extraction and the possibility that erroneous assumptions may at times be provided to different software modules such as a field solver. Equation (3) may be used for this reasonableness check:

$$(L'C)^{-1/2}=c_0(\epsilon_r)^{-1/2} \quad (3)$$

Equation (3) may be rewritten as:

$$L'=\epsilon_r/Cc_0^2 \quad (3a)$$

In equations (3) and (3a), L' is a calculated inductance for the line segment analyzed in the primitive, C is a capacitance of the line segment calculated as described below, $c_0$ is the speed of light in a vacuum, and $\epsilon_r$ is an effective dielectric constant of the dielectric material surrounding the line segment.

Figure 12:
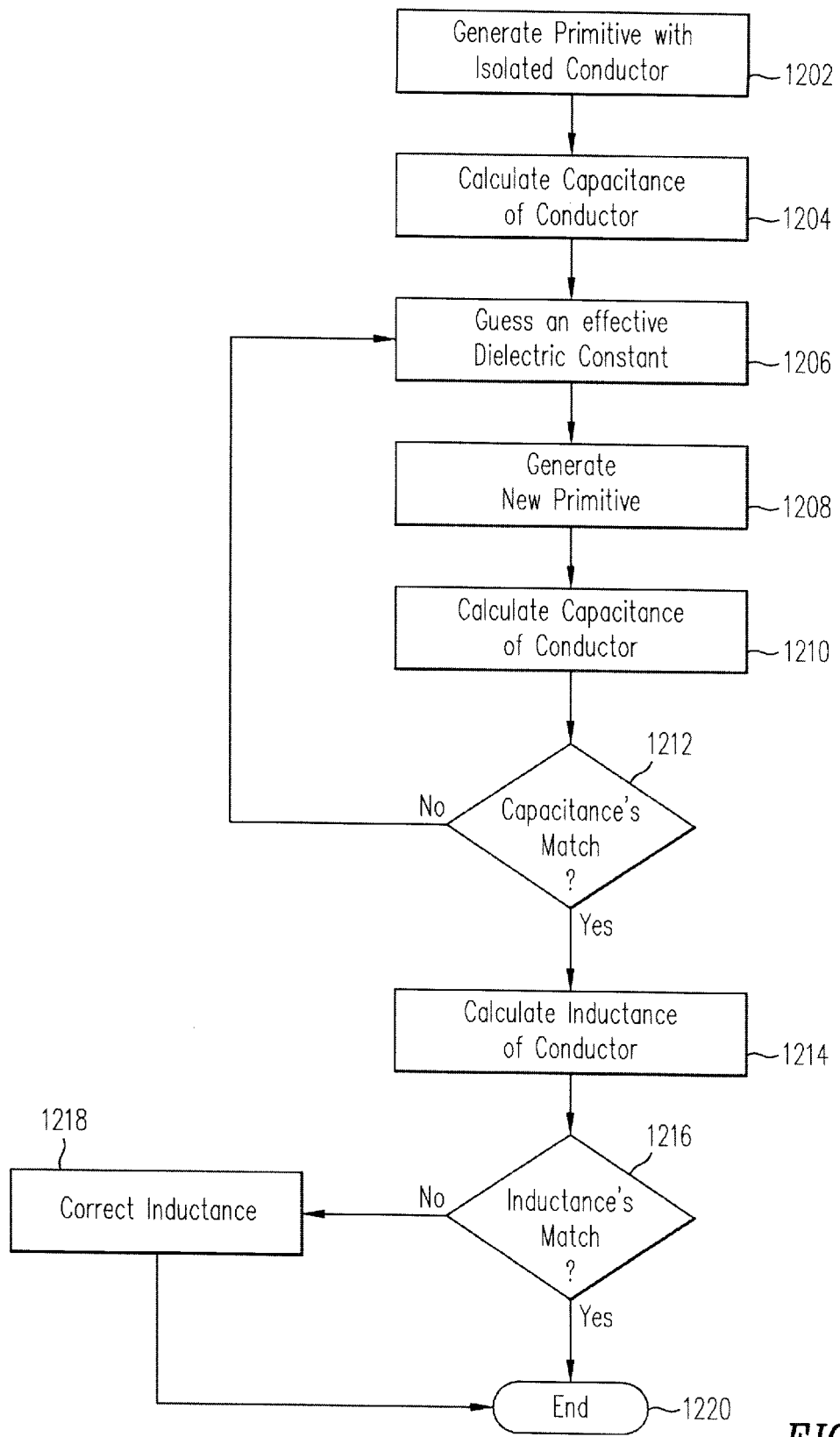
FIG. 12 is a flowchart illustrating a reasonableness check method for calculated inductance values in accordance with one embodiment of the present invention.

Referring to FIG. 12, a flowchart illustrating a reasonableness check method in accordance with one embodiment of the present invention is shown. This method may be followed by interconnect library builder 301 after any inductance value is calculated for a metal layer as previously described.

The method begins at step 1202, where interconnect library builder 301 generates a primitive with a single conductor. The conductor has the thickness and material properties of the metal layer for which an inductance value was calculated. The conductor also has a representative width, preferably the same width as was used to calculate the inductance value. The conductor also has a representative length, for example 20 times the conductor width. This primitive also includes all of the dielectric layers and the substrate specified in technology profile 302.

At step 1204, this primitive is used as input for a capacitance-capable field solver 305. The field solver calculates a capacitance C for the isolated conductor in the primitive.

At step 1206, an effective dielectric constant is estimated for the dielectric layers surrounding the isolated conductor in the primitive. For example, the effective dielectric constant may be estimated to be either the arithmetic mean or the statistical median of the dielectric values for all of the dielectric layers surrounding the isolated conductor.

At step 1208, a new primitive is generated with the same dimensions as the previous primitive. The new primitive has an isolated conductor just as described above. However, the dielectric layers surrounding the isolated conductor are replaced by a single dielectric material with the effective dielectric constant that was estimated in step 1206.

At step 1210, the new primitive is used as input for a capacitance-capable field solver 305. The field solver calculates a new capacitance C' for the isolated conductor in the primitive.

At step 1212, the two capacitances C and C' are compared to see whether they are equal within an allowed margin of error, such as one percent. If C and C' do not match, then interconnect library builder 301 returns to step 1206 to guess a new effective dielectric constant. The new effective dielectric constant will of course be greater or less than the previously estimated effective dielectric constant, as is required to produce a capacitance C' that more closely matches the capacitance C.

Steps 1206 through 1212 are repeated until the two capacitances C and C' match within the margin of error. At that point, the effective dielectric constant estimated at step 1206 has been refined to a desired degree of accuracy.

Interconnect library builder 301 then proceeds to step 1214, where an inductance L' is calculated using equation (3a). In equation (3a), C is the capacitance of the isolated conductor as calculated in step 1204 and $\epsilon_r$ is an effective dielectric constant of the dielectric material surrounding the line segment as estimated in the final iteration of step 1206.

At step 1216, the inductance L which is to be checked for reasonableness is compared to the inductance L' calculated as just described. Due to the nature of the methods used to calculate the inductance values L and L', and in particular due to the fact that the actual speed of light c in a given material must be less than $c_0$ (the speed of light in a vacuum), the L' value is expected to be less than or equal to the L value. Thus, if L'>L, the process is stopped and the error reported to the user. The user may typically fix this type of error by providing corrected input data.

If the two inductance values L and L' differ by more than a reasonable margin, such as, for example, ten percent, then interconnect library builder 301 proceeds to step 1218 where the inductance value L is corrected in light of the inductance L' calculated as described above. One exemplary method for correcting L is to set L=k*L', where k is a "reasonable" ratio which may be obtained as outlined below. If L is much greater than L', for example by a factor of four or more, then the process may be stopped and the error reported to the user, who may provide corrected input data. After L has been corrected, or if no correction of L was required, the method ends at step 1220.

It will be understood that the method described above in connection with FIG. 12 provides a means for ensuring that unreasonable inductance values are not stored in interconnect primitive library 304. Equation (3a) may also be used to prevent unreasonable results during parasitic extraction, as will be described more fully below.

In the above-described reasonableness check method, a constant threshold or margin (e.g. ten percent) is used in the comparison of the inductance values L and L' to determine whether L is reasonable. In an alternative embodiment, the comparison threshold (k) may vary according to the results of previous comparisons. Thus, for example, the first time a reasonableness check is performed for an inductance value L, an initial threshold $k_0$ may be used at step 1216 to determine whether this inductance value is reasonable. This threshold $k_0$ may be, for example, three. That is, since L is always greater than or equal to L', the ratio L/L' is checked to ensure that it does not exceed three. If the condition is met (a "yes" result at step 1216), then the ratio L/L' (=$k_1$) is used to modify the reasonableness threshold (k) used at step 1216. For example, in one embodiment, Equation (4a) is used to calculate a new threshold value k as follows:

$$k=(100*k_0+k_1)/101 \qquad (4a)$$

This threshold value k is then used the next time a reasonableness comparison is performed at step 1216. If another affirmative result is obtained from that comparison, then a new ratio $k_2$=L/L' is calculated, and the threshold value k is updated once again, for example using Equation (4b):

$$k=(100*k_0+k_1+k_2)/102 \qquad (4b)$$

After a third reasonableness check, if an affirmative result is obtained at step 1216, yet another update of the threshold value k may be performed as follows:

$$k=(100*k_0+k_1+k_2+k_3)/103 \qquad (4c)$$

This modification of the threshold value k may continue indefinitely. Generally a value of k in which $2.5 \geq k \geq 1$ is expected. It will be understood that the weighting factor of 100 given to $k_0$ in Equations (4a), (4b) and (4c) is exemplary only, and may be changed to provide more or less alteration of the threshold value k by subsequent comparisons.

Interconnect primitive library 304 also includes information used by parasitic extractor 306 to calculate parasitic resistance and capacitance. The form which this information takes in interconnect primitive library 304 and the manner in which it is used by parasitic extractor 306 will be described more fully below in connection with the operation of parasitic extractor 306.

As previously stated, parasitic extractor 306 decomposes for analysis the physical interconnect structures along a signal path. The decomposed structures are then mapped into the interconnect primitives of interconnect primitive library 304. The interconnect primitives and their associated impedances are used to provide an RLC circuit description 309 for the decomposed interconnect structures. RLC circuit description 309 can then be used by a circuit simulator such as the well-known SPICE circuit simulator to obtain accurate signal delays.

Figure 4:
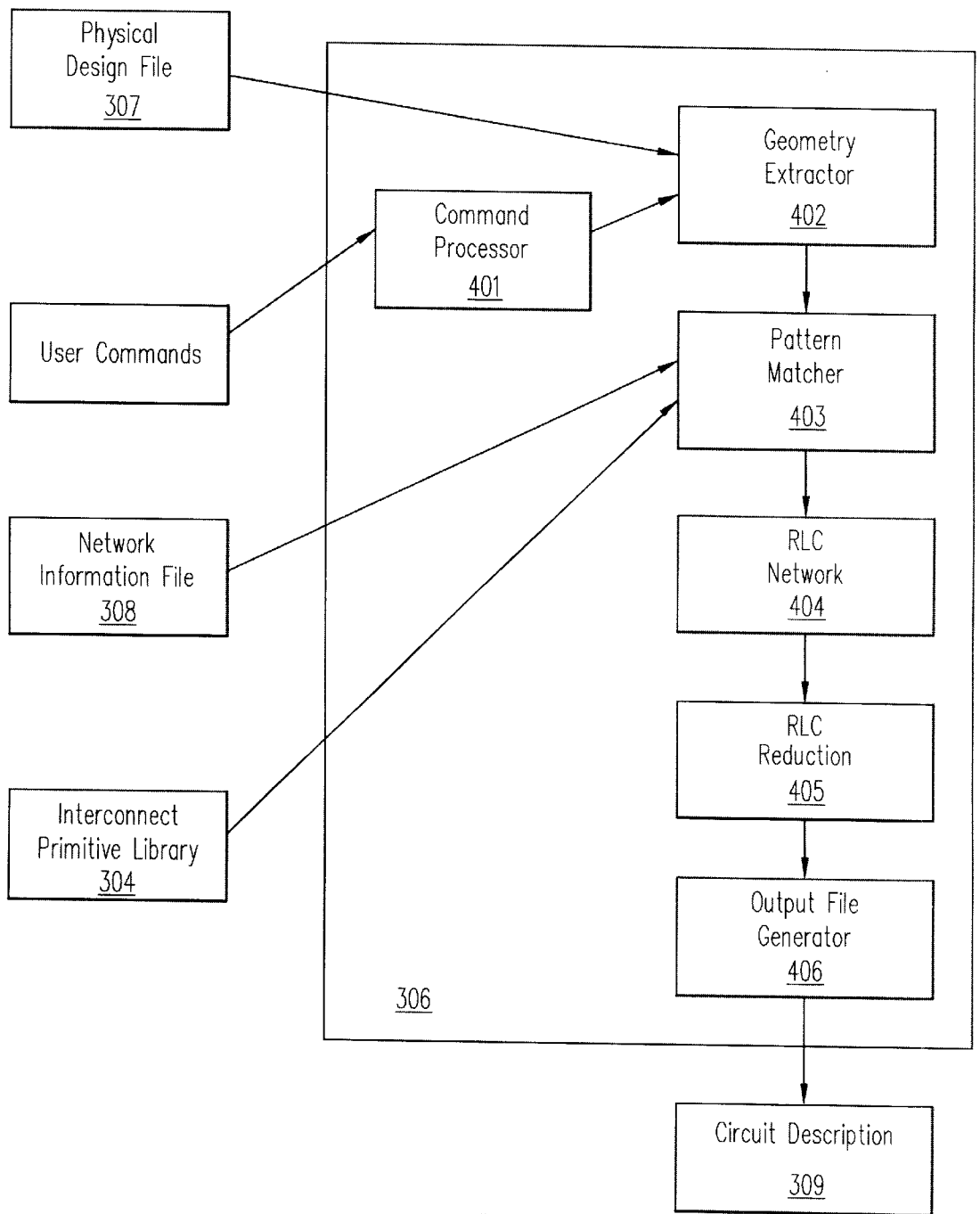
FIG. 4 is a block diagram of the parasitic extractor.

FIG. 4 is a block diagram of parasitic extractor 306. Parasitic extractor 306 provides a command processor 401 as a user interface. Parasitic extractor 306 receives as input data a physical design file 307, a network information file 308, and a layer mapping file (not shown) which provides a link between GDS II layer numbers and known layer names. Physical design file 307 is typically represented in the GDS II format, which is familiar to those skilled in the art. When parasitic extractor 306 receives a physical design, a geometry extractor module 402 reorganizes the physical geometries represented in the GDSII data into a database (not shown) that is optimized for quick access. In the present embodiment, to minimize the memory required by parasitic extractor 306, and to allow quick access, this database is stored in a number of temporary files which are brought into memory as needed.

Once interconnect primitive library 304 and physical design file 307 are accessed by parasitic extractor 306, and organized in the database discussed above, parasitic extractor 306 begins analysis of individual signal paths ("nets"). The user can specify through command processor 401 any or all nets specified in physical design file 307. Specific nets may be identified by in network information file 308. One or more current return paths, which will be used to calculate the inductance of the specified net, may also be specified in network information file 308.

When analyzing the coupling effects of neighboring interconnect structures in a sub-micron design, only interconnect structures within a certain "concern distance" of the net being traced need to be analyzed. This concern distance is process-specific, and depends upon the conductor layers of the net being analyzed. The concern distance for each metal layer may be stored in interconnect primitive library 304 as previously described.

Thus, as geometry extractor module 402 traces a line along the signal propagation direction, the relevant surrounding interconnect structures for the analysis are encompassed in a logical "tunnel" centered on the line being analyzed and extending to the "concern distance". Only conductor structures having at least a portion found within the space of the logical tunnel are considered to contribute to the coupling capacitances of the net being analyzed.

Once geometry extractor module 402 has traced a net and identified the relevant surrounding interconnect structures, the line being analyzed (and the surrounding interconnect structures) are fractured into a collection of 3-dimensional sections known as "change areas." A change area is established whenever a change is found in the geometry of the line being analyzed, e.g., a change in line width, or a change in the geometry of any neighboring conductor within the surrounding interconnect structures.

In the present embodiment, for each change area of the line being analyzed, parasitic extractor 306 computes in pattern matcher module 403 the following: (a) a series resistance for the line segment of the line being analyzed in the change area, based on the line segment's dimensions within the change area and the resistivity of the line segment's specific constituent material, as provided in interconnect primitive library 304; (b) a capacitance coupling the line segment to the ground reference (substrate); (c) a coupling capacitance, inclusive of parallel plate and fringing capacitances, coupling the line segment to the nearest parallel line on the same conductor layer as the line being analyzed; (d) coupling capacitances, inclusive of parallel plate and fringing capacitances, each coupling the line segment to interconnect structures within the logical tunnel in a neighboring conductor layer; (e) via resistances and capacitances; and (f) an inductance for the line segment being analyzed based on the distance to the current return path and the operating frequency of the circuit. In computing via resistances, the resistance of each via is provided in interconnect primitive library 304. If the line segment is associated with multiple vias, e.g., vias grouped together in a "via farm," the vias resistances are combined in parallel to provide a single via resistance for the change area.

Figure 9:
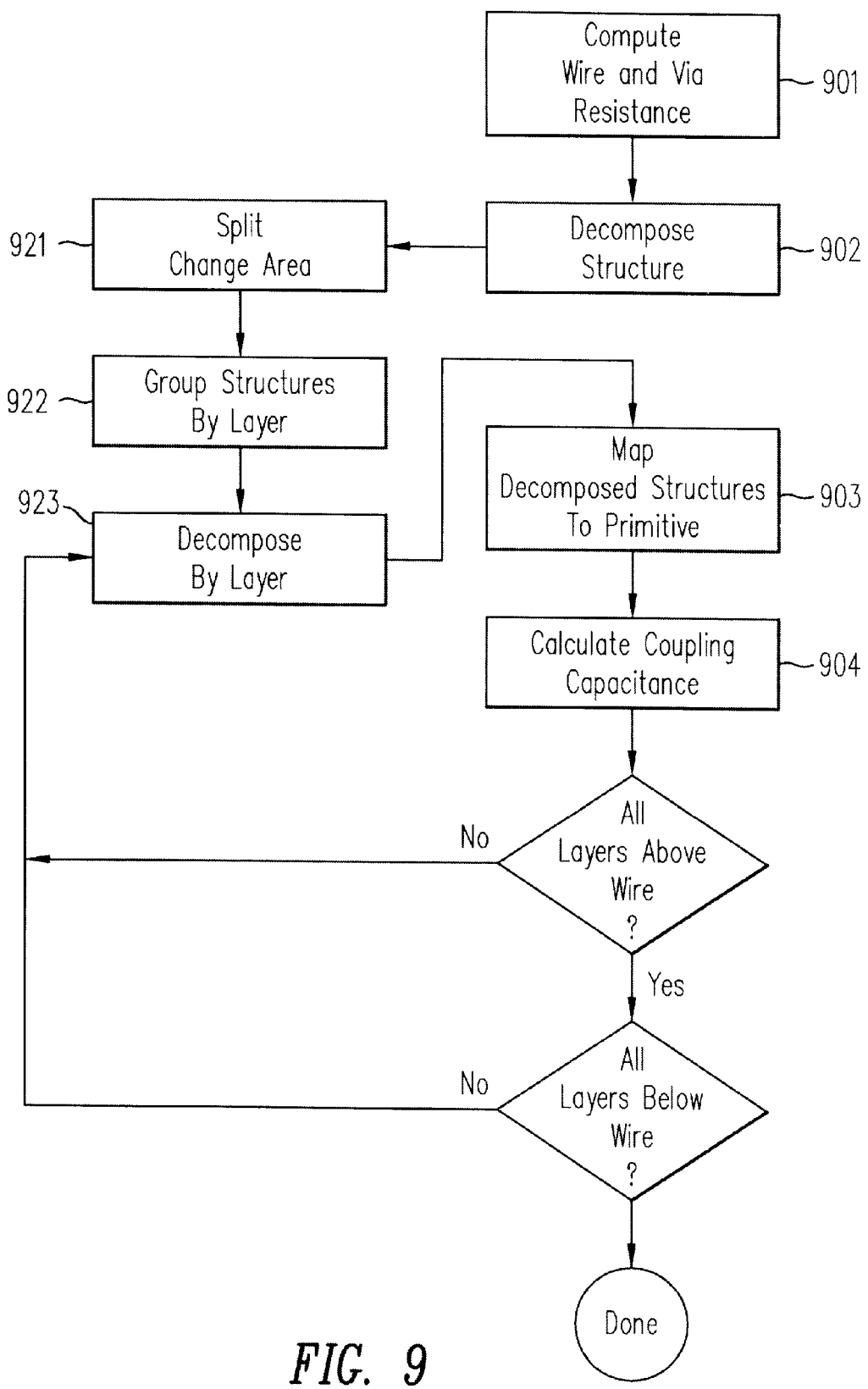
FIG. 9 is a flow chart illustrating the operation of a pattern matcher module.

The operation of pattern matcher module 403 is explained in conjunction with the flow chart 900 shown in FIG. 9. The line segment's resistance and any associated via resistance are first computed (step 901). Then, pattern matcher module 403 computes the coupling capacitances to the surrounding structures (i.e., interconnect structures not on the same conductor layer as the line segment). To compute the coupling capacitances, pattern matcher module 403 decomposes the structures of surrounding conductors at step 902. Step 902 is further illustrated by steps 921–923 in FIG. 9. In the decomposition step 902, pattern matcher module 403 first splits the change area into a left side and a right side along the signal propagation direction (step 921). Since the coupling of structures on the left and right sides are reasonably considered independent of each other, in each change area, pattern matcher module 403 can treat decomposed structures on the left and right sides independently of each other. Next, at step 922, pattern matcher module 403 groups neighboring structures according to their respective conductor layers. At step 923, pattern matcher module 403 selects a conductor layer and its associated structures for processing in subsequent steps 903 and 904, beginning with structures of the conductor layer directly above the conductor layer containing the line segment being analyzed. For each selected conductor layer, at step 903, pattern matcher module 403 maps the decomposed structures into interconnect primitives of interconnect primitive library 304. This mapping process will be described more fully below.

Pattern matcher module 403 then calculates, at step 904, a combination of resistance and capacitance values from the process data associated with the mapped interconnect primitives of the interconnect primitive library 304. Pattern matcher 403 then returns to step 923 to select structures in the next conductor layer above, if any, until all conductor layers above the line segment being analyzed are processed. Steps 923, 903 and 904 are then repeated for all conductor layers below the line segment being analyzed, again starting with the conductor layer directly below the layer containing the line segment being analyzed in order of increasing distance from the line segment being analyzed.

The coupling capacitance values that pattern matcher module 403 computes for a decomposed structure of a particular conductor layer are initially calculated independent of other conductor layers, under a simplifying assumption. To correct for this assumption, pattern matcher module 403 applies two different corrections, or "shielding factors", to account for capacitance effects due to the presence of other conductor layers. The first set of shielding factors ("same-side shielding"), which are applied to coupling capacitance values, account for the presence of structures in conductor layers between the structures in the conductor layer under consideration and the line segment being analyzed. For example, while the structures in the conductor layer directly above or below the line segment being analyzed can be considered independent of the conductor layers further away from the line segment being analyzed, structures in a conductor layers two conductor layers away from the line segment being analyzed are physically and electrically shielded by structures in the intervening conductor layer directly above or below the line segment being analyzed. Likewise, structures in conductor layers three layers away from the line segment being analyzed are shielded by the two intervening conductor layers between the line segment being analyzed. Two same-side shielding factors are used: one for compensating shielding by conductor layers above the line segment being analyzed, and the other one for compensating shielding by conductor layers below the line segment being analyzed. In the present implementation, each same-side shielding factor is a simple scaling factor, based upon an estimate of the calculated coupling capacitance as a percentage of a hypothetical maximum possible coupling capacitance between the line segment being analyzed and the conductor layer directly above or below, as the case may be. The hypothetical maximum possible coupling capacitance is provided as the coupling capacitance between the line segment being analyzed and a sheet of the next conductor layer blanketing the logical tunnel. For calculating the coupling capacitances between the line segment being analyzed and the structures in the conductor layer directly above or below it, the same-side shielding factor is zero, as there is not an intervening conductor layer between such a conductor layer and the line segment being analyzed. Within each change area, the same-side shielding factor seen by each conductor layer is cumulative of the same-side shielding factors seen by conductor layers closer to the line segment being analyzed. Once the same-side shielding factor reaches 100%, structures in conductor layers further away do not contribute to the coupling capacitance estimation.

A second kind of shielding factors, consisting of an "above-shielding factor" and a "below-shielding factor", correct for the effects that structures in conductor layers above the line segment being analyzed have on coupling capacitance values to structures in conductor layers below the line segment being analyzed, and vice versa. The above-shielding factor is based on the percentage of the hypothetical maximum capacitance that structures in conductor layers above the line segment being analyzed have accumulated, inclusive of same-side shielding effects. The above-shielding factor is used to look up a correction for each coupling capacitance between the line segment being analyzed and structures in conductor layers below it. Likewise, the "below-shielding" factor is based on the percentage of the maximum capacitance that structures in conductor layers below the line segment being analyzed have accumulated, inclusive of same-side shielding effects. The below-shielding factor is used to look up a correction for each coupling capacitance between the line segment being analyzed and structures in conductor layers above it. The actual values of these corrections are process-specific and are provided as tables in interconnect primitive library 304. These tables, which are derived by 3-dimensional field solver runs, are indexed by the width of the line segment being analyzed and the spacing to the nearest parallel neighboring line in the conductor layer of the line segment being analyzed. The above-shielding and below-shielding correction values are derived by varying the percentage of maximum coupling to structures above or below a charged line, and solving the effects of the shielding on structures on the opposite side.

In step 904, pattern matcher module 403 also computes on each side, i.e., its right side and its left side, a coupling capacitance between the line segment being analyzed and the nearest parallel line in the same conductor layer. To compute this coupling capacitance, pattern matcher module 403 locates the nearest structure in the conductor layer of the line segment being analyzed and obtains the spacing between the line segment being analyzed and that nearest structure. The shielding effects of the conductor layers above and below the line segment being analyzed are also taken into consideration. The spacing, which is also used to break down and to characterize the structures on other conductor layers, is used to look up capacitance tables in interconnect primitive library 304. As with "above-shielding" and "below-shielding," each table represents data points along the curves relating coupling capacitance to the nearest parallel neighbor (labeled $C_c$) and the percentage of maximum coupling capacitance calculated to structures in conductor layers above and below the line segment being analyzed. Each table can be interpolated to obtain intermediate values between data points. The data contained in the tables are obtained in simulations by a field solver, under various percentages of maximum coupling between a charged line and structures above or below the charged line.

The coupling capacitance between the line being analyzed and each of its neighboring conductor lines is calculated under the assumption that the line being analyzed is statically charged, while all other nets are at ground reference, i.e. the effects of switching are ignored. The greatest switching effect on the coupling capacitance occurs when the line being analyzed and a neighboring net both switch at the same time, but in the opposite directions. To capture this switching effect, the static coupling capacitance between the two nets (i.e. the line being analyzed and the neighboring net) can be estimated by a capacitor to ground reference having twice the static coupling capacitance, according to the "Miller equivalent" model. Thus, when pattern matcher module 403 calculates a coupling capacitance between the line segment being analyzed and another line, the coupling capacitance is converted to a coupling capacitance between the line segment being analyzed and the ground reference, multiplied by a 'switch factor', which ranges from 1 to 2, depending on whether or not the line segment being analyzed should be assumed to simultaneously switch with a neighboring net. In this embodiment, parasitic extractor 306 operates in one of three modes: (a) static mode, in which all switch factors are set to 1 (i.e. no nets are switching), (b) switch mode, in which specifically identified nets have switch factors set to 2, and (c) worst-case mode, in which all switch factors, except specifically identified nets (e.g. power and ground), are set to 2. Thus, to run an analysis under parasitic extractor 306, a user selects through command processor 401 one of the three modes (i.e. static, switch or worse-case) discussed above, provides the names of the nets to be analyzed, and a list of static or switching nets, as appropriate.

The method described above with reference to FIG. 9 allows for accurate calculation of the parasitic resistance and capacitance of a segment of the line being analyzed. The calculation of parasitic inductance may be carried out in conjunction with the method illustrated in FIG. 9, or may be carried out independently of that method. In either case, the method for calculating inductance is illustrated in FIG. 11.

Figure 11:
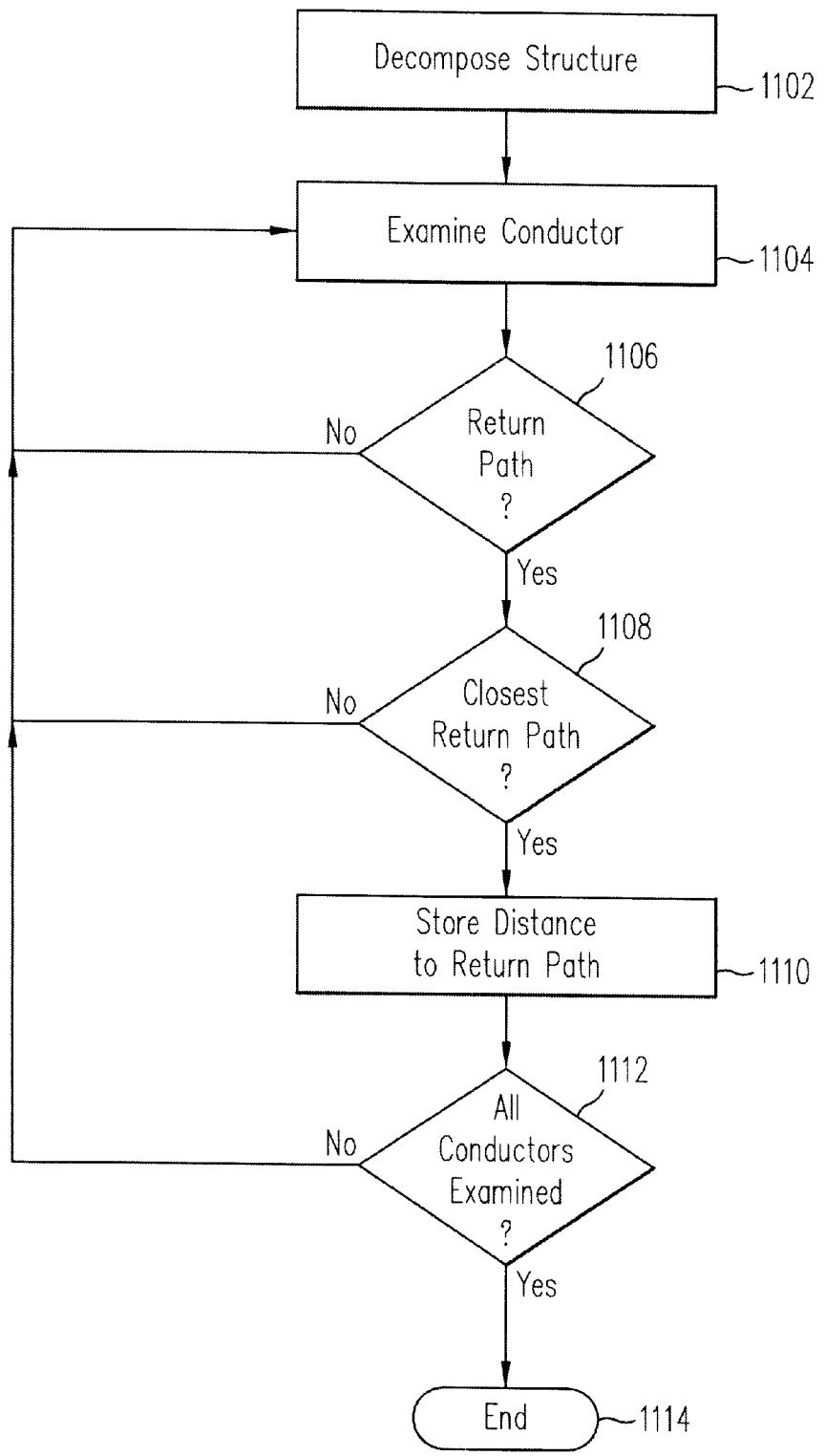
FIG. 11 is a flowchart illustrating a method for calculating parasitic inductance.

Referring to FIG. 11, at step 1102, pattern matcher 403 decomposes the change area into right and left halves as described above with respect to FIG. 9. Within each half of the change area, conductors other than the line being analyzed are selected one-by-one for analysis. Thus, at step 1104 a conductor is selected for further analysis.

At step 1106, pattern matcher 403 determines whether the currently selected conductor is a return path for the line being analyzed. This determination may be made using one or more of several different criteria. In any case, this determination generally requires that the currently selected conductor be traced through the integrated circuit layout to determine what signal, if any, is carried by the conductor.

One criterion that may be used to determine whether the currently selected conductor is a return path is whether the conductor has been designated by the user as a return path. Thus, if the conductor may be traced to establish a DC connection between the conductor and a location designated in network information file 308 as a return path for the line being analyzed, then the conductor may be assumed to be a return path.

Another criterion that may be used to determine whether the currently selected conductor is a return path is whether the conductor is DC connected to a power or ground reference source. If so, then the currently selected conductor may be assumed to be a return path for the line being analyzed. Yet another criterion that may be used to determine whether the currently selected conductor is a return path is whether the currently selected conductor and the line being analyzed form a differential signal pair. This information may also be contained in network information file 308. If the currently selected conductor and the line being analyzed form a differential signal pair, then the currently selected conductor may be assumed to be a return path for the line being analyzed.

Regardless of the criteria used at step 1106, if the currently selected conductor is determined not to be a return path for the line being analyzed, then pattern matcher 403 returns to step 1104 to select a new conductor within the change area for examination.

If the currently selected conductor is determined to be a return path for the line being analyzed at step 1106, then pattern matcher 403 determines at step 1108 whether the currently selected conductor is physically closer to the line being analyzed than any previously found return path in the change area. This may be determined by calculating the straight-line distance between the two closest points on the line being analyzed and the currently selected conductor. This distance is compared to the stored distance for a previously found return path, if indeed any return path has previously been found in the change area. If the distance comparison shows that the currently selected conductor is further from the line being analyzed than a previously identified return path, then pattern matcher 403 returns to step 1104, where another conductor within the change area is selected for examination.

If, at step 1108, the currently selected conductor is determined to be the closest return path yet found for the line being analyzed, then the distance between the currently selected conductor and the line being analyzed is stored in memory at step 1110. Then, at step 1112, pattern matcher 403 determines whether all conductors in the change area have been examined. If so, the method ends at step 1114. If any conductors remain to be examined pattern matcher 403 returns to step 1 104 to select another conductor for examination.

If, at step 1108, the currently selected conductor is determined to be the same distance from the line being analyzed as a previously identified return path, then a return path count number in memory may be increased (e.g. from one to two). This return path count number may then be used to select a corresponding inductance function from interconnect primitive library, as previously described. Parasitic extractor 306 then proceeds to step 1112 as previously described.

In an alternative embodiment, step 1108 remains substantially as described above, with the exception that the currently selected conductor need not be exactly the same distance from the line being analyzed as a previously identified return path in order for the return path count number in memory to be increased. Thus, if the distance between the currently selected conductor and the line being analyzed differs by no more than 20% from the distance between the line being analyzed and a previously found return path, then the return path count number in memory is increased (e.g. from one to two). This return path count number may then be used to select a corresponding inductance function from interconnect primitive library, as previously described.

Pattern matcher 403 then stores, as the distance to return path for the line being analyzed, the average of the return path distances for the currently selected conductor and any previously found return paths. Thus, when the return path count number is one and the currently selected conductor is a return path nor more than 20% closer or further away to the line being analyzed than the previously identified return path, the return path count number is incremented to two and the distance to return path stored in memory is equal to the sum of the two return path distances, divided by two. This stored distance to return path may then be used to calculate an inductance using interconnect primitive library, as previously described. In this alternative embodiment, if the distance between the currently selected conductor and the line being analyzed differs from the previously stored return path distance by more than 20%, then step 1108 is completed substantially as previously described. Thus, if the currently selected conductor is further from the line being analyzed than the previously identified return path by more than 20%, then pattern matcher 403 returns to step 1104 as described above. If the currently selected conductor is closer to the line being analyzed than the previously identified return path by more than 20%, then the currently selected conductor effectively becomes the new (singular) return path at step 1110, with no increase in return path number, as described above. While a distance comparison factor of 20% is used herein for illustrative purposes, it will be understood that other comparison criteria, quantified in percentage terms or in absolute distance, may alternatively be used.

In yet another alternative embodiment, both the first and second alternatives described above for step 1108 are used to calculate two different inductances for the line being analyzed. These two inductances may then be compared. Since the inductance calculations described herein in most cases represent overestimates of the actual amount of inductance inherent in the circuit, the smaller of the two inductance values may be chosen as the final inductance value for the line being analyzed.

Returning to FIG. 11, if no return path is found within the change area, then a default assumption may optionally be made that the integrated circuit substrate is the return path for the line being analyzed. The distance from the line being analyzed to the substrate may therefore be stored in memory as the distance to return path.

In another alternative embodiment, one particular type of conductor may under certain circumstances be counted as two return paths. This may occur when the currently selected conductor is a so-called "ground plane," which includes any conductor which is DC connected to a power or ground reference source, but does not include the semiconductor substrate. In this alternative embodiment, "ground plane" conductors are subjected to additional evaluation which is not used for other types of potential return paths. Each "ground plane" conductor is tested to determine (a) whether the conductor is present in both the left and right halves of the decomposed change area; and (b) whether the conductor is more than twice as wide as the line being analyzed. If both of these conditions are met, and the conductor is otherwise a suitable return path for the line being analyzed (e.g. the appropriate conditions at step 1108 are also met), then the return path count number is increased by two (e.g. from zero to two), and the distance from the line being analyzed to the currently selected conductor is stored as the distance to return path as described above.

The result of the method illustrated in FIG. 11 is that the distance from the line being analyzed to the closest return path(s) is stored in memory, along with a return path count. Pattern matcher 403 may then calculate an inductance for the line segment being analyzed using the inductance tables of interconnect primitive library 304. As previously stated, interconnect primitive library 304 contains a parameterized inductance function for each metal layer, in which the parameters are conductor width, distance to return path, and in some cases operating frequency. Thus, using the width of the line being analyzed, the stored distance to return path calculated above, and the specified operating frequency of the circuit, pattern matcher 403 may interpolate or extrapolate as needed from the inductance table for the metal layer which contains the line being analyzed.

In one particular embodiment, pattern matcher 403 first interpolates using the width of the line being analyzed and the distance to return path to arrive at a set of inductance values. Each inductance value corresponds to one of the selected frequencies within the specified frequency range chosen by interconnect library builder 301 for inductance calculation. Using this set of inductance values and the specified actual operating frequency of the integrated circuit, pattern matcher 403 may then interpolate or extrapolate to derive an inductance value corresponding to the actual operating frequency of the integrated circuit. This interpolation or extrapolation process may involve linear interpolation/extrapolation or a more complex curve-fitting algorithm, depending in part on the number of frequencies for which inductance values have been stored in interconnect library builder 301 as previously described.

In this manner, an inductance value is calculated for the segment of the line being analyzed in the present change area. This process may be repeated for each change area as the line being analyzed is traced to its specified terminus. In this manner, a set of resistance, capacitance and inductance values are accumulated for the line being analyzed.

Once the total capacitance and inductance are calculated for the line being analyzed, the total inductance value may be checked for reasonableness using Equation (3a). In this case, C is the total capacitance value calculated as described above for the line being analyzed. An inductance value L' is calculated using Equation (3a) and compared with the total inductance value L for the line being analyzed. If the two inductance values are different by more than a reasonable margin, such as, for example, ten percent, then the inductance value L is corrected in light of the inductance value L'. One exemplary method for correcting L is to set L=L', but other methods such as averaging the two values may also be used.

After the line being analyzed is completely analyzed, RLC network module 404 combines the resistors, capacitors and inductors generated by pattern matcher module 403 for the line being analyzed to form an RLC network. This approach creates an independent RLC network that accurately models the interconnect net. For each change area, RLC network module 404 generates an RLC circuit which is configured as a "π" or "pi" structure.

Figure 7:
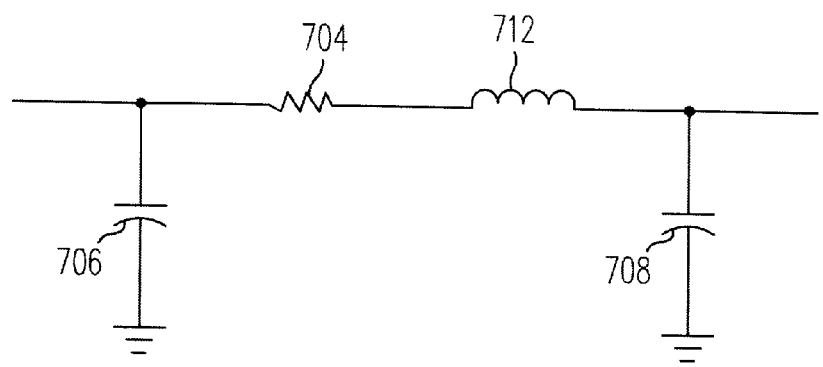
FIG. 7 shows an RLC network output by an RLC network module for a regular line segment.

FIG. 7 shows an RLC network 700 output by RLC network module 404 for a regular line segment. As shown in FIG. 7, the resistance and inductance calculated for the line segment are formed as a resistor 704 and an inductor 712 connected in series. All individual coupling capacitances (converted to ground capacitances) are combined and equally split into capacitors 706 and 708, which are placed at electrical nodes connected to the outer termini of resistor 704 and inductor 712.

Figure 8:
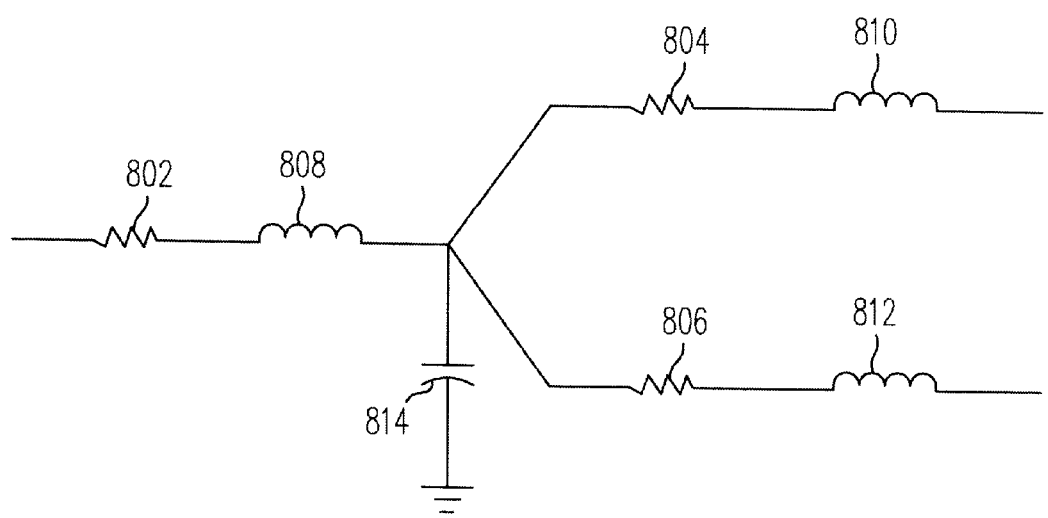
FIG. 8 shows an RLC network output by the RLC network module for a "T" junction.

In the case of a corner or a "T" junction in the line segment being analyzed, RLC network module 404 outputs a slightly different network. FIG. 8 shows the output network for a "T" junction. In FIG. 8, the "T" junction resistance is divided into three equal resistances 802, 804, 806. Each of these resistors are connected at a common electrical node coupled to the ground reference by a single capacitor 814 (which represents the combined coupling capacitances for that change area). Each of resistors 802, 804, 806 connects to an electrical node in a change area adjacent the "T" junction. The inductance calculated for the "T" junction is represented by three equal inductors 808, 810, 812, each inductor being connected in series with one of the resistors 802, 804, 806.

For each net analyzed, RLC network module 404 combines the RLC networks of all the change areas of the net to provide a full RLC model for the net, for example in SPICE netlist format. Parasitic extractor 306 includes an RLC network reduction module 405, which can be used to reduce the fill RLC model to provide a reduced RLC model, using well-known linear network reduction techniques. The reduced RLC model, which may also be in SPICE netlist format, is suitable for obtaining better runtime performance in some delay calculators.

In one embodiment of the present invention, RLC network reduction module 405 may also reduce the RLC network generated by RLC network module 404 to an equivalent RC network. This may be useful when the circuit simulator which will be used to analyze the output of parasitic extractor 306 is not capable of utilizing inductance values in calculating signal timing. Thus, in this embodiment RLC network reduction module 405 eliminates the inductors in the RLC network and alters the resistors and capacitors in the RLC network so as to produce approximately equivalent line delays when a circuit simulation is run.

One way to produce an equivalent RC circuit is to leave the capacitors unchanged and to use a new resistance R' for each resistor originally having a resistance R. Equation (5) gives a formula for calculating R'.

$$R'=R*(1+(\omega_0 L/2R)) \qquad (5)$$

In Equation (5), L is the calculated inductance and $\omega_0$ is the dominant pole of the RLC network, with L being neglected, as follows:

$$\omega_0=1/RC \qquad (6)$$

In Equation (6), R and C are the resistance and capacitance values, respectively of the RLC network. Using Equation (6), Equation (5) becomes:

$$R'=R*(1+(L/2*R*C^2) \qquad (7)$$

The RC circuit generated by RLC network reduction module 405 may be used to determine line delays as previously described.

It will be understood, of course, that the reduction of RLC networks to RC networks as described above may alternatively be carried out by RLC network module 404 at the level of RLC network 700. RLC network module 404 would then produce an RC network instead of an RLC network 700 for RLC network reduction module 405.

After generating an RLC or RC network as described above, RLC network reduction module 405 invokes output file generation module 406 to write the traced net into file 407, which can be used as an input data file for one of many design tools such as SPICE circuit simulators.

The process for mapping change area structures into interconnect primitives in interconnect primitive library 304 for the purposes of capacitance calculation will now be described in detail. In the present embodiment, parasitic extractor 306 decomposes the lines that surround the line being analyzed into structures that can be mapped into the interconnect primitives, which are characterized by precalculated capacitances, resistances and inductances stored in interconnect primitive library 304.

In physical design file 307, the surrounding conductors are represented by polygons in the vicinity of the line segment being analyzed, which is itself also represented in physical design file 307 by one or more polygons. Each interconnect primitive represents physical components of structures defined by the polygons of the line segment being analyzed and the surrounding lines. Thus, an interconnect primitive is characterized by the combination of the following: (a) the conductor layer containing the line segment being analyzed (the "LBA layer"); (b) the conductor layer containing the interconnect primitive (the "neighbor layer"); (c) the location of the interconnect primitive relative to the line segment being analyzed ("bin location"); (d) the amount of additional other interconnect primitives on the same neighbor layer ("bin factors"); (e) interconnect primitive type (which structural component is being represented); (f) width of the line segment being analyzed ("LBA width"); and (g) spacing between the line segment being analyzed and its nearest, parallel neighbor in the conductor layer of the line segment being analyzed ("spacing").

Each interconnect primitive in interconnect primitive library 304 is identified by a key including two "layer factors" and one or more "bin factors". The layer factors identify (a) the layer containing the line being analyzed, and (b) the neighbor layer. For example, if the signal being traced is on metal layer II (i.e. "M2"), and the neighboring layer under consideration is metal I ("M1"), the interconnect primitive to be mapped is characterized by the layer factors M2 and M1.

The bin factors encode, within the present change area, the location of the interconnect primitive itself with respect to the line segment being analyzed and the locations of other polygons in the same neighbor layer. Note that, as discussed above, when calculating bin factors for a particular combination of layer factors, pattern matcher module 403 considers neighboring interconnect primitives on the "right-hand side" and "left-hand side" of the line segment being analyzed independently. On both sides, Bin 1 is the bin closest to the center of the line segment being analyzed. In addition, the number of bins and their sizes are not fixed. If the space of interest is divided into three bins, as in the present embodiment shown in FIG. 5 discussed below, eight bin factor combinations—the values for bin factors (0, 0, 0) are provided for interpolation purposes—are provided for each combination of conductor layers. For each conductor layer, the number of bins and their respective sizes are specified in interconnect primitive library 304. The selection of bin sizes depends upon achieving the desired modeling accuracy for a particular fabrication process. In this embodiment, the bin size is parameterized by the width of the line segment being analyzed. For example, for a line segment in metal layer M2 of a given fabrication process, interconnect primitive library 304 specifies that the neighboring area of interest is divided into 3 bins, having boundaries at (0.5, 1.0, Max). This notation represents: (a) bin 1, which includes the space between the center of line segment being analyzed to 0.5 times the width of the line segment being analyzed; (b) bin 2, which includes the space from 0.5 times the line being analyzed width to 1.5 times the line being analyzed width; and (c) bin 3, which includes the space from 1.5 times the line segment being analyzed width to a specified maximum ("concern distance") for the M2 layer.

Figure 5:
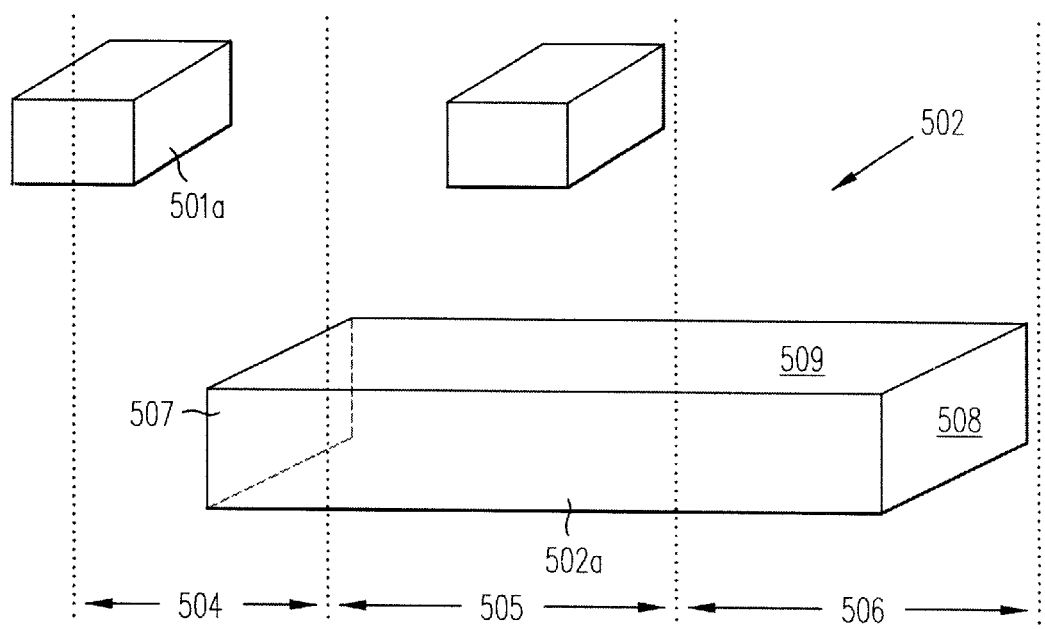
FIG. 5 illustrates the use of bin factors.

FIG. 5 illustrates the use of bin factors. As shown in FIG. 5, the line being analyzed 501a is in conductor layer 501 and a line 502a is in neighboring layer 502. Line 502a spans a certain distance in a direction orthogonal to the direction of 501a. In the embodiment shown in FIG. 5, the space surrounding line 501a is divided into three "bins" 504–506, although the number of bins to use depends upon achieving the desired modeling accuracy for a specific fabrication process. As shown in FIG. 5, line 502a occupies bin 505 fully, but only fractionally in bins 504 and 506. When considering this neighbor layer, Pattern matcher module 403 assigns, based on the respective occupancies of bins 504–506, bin factors 0.5, 1, and 0.5 (written hereafter "(0.5, 1, 0.5)"). Thus, to map the configuration shown in FIG. 5, pattern matcher module 403 would search in interconnect primitive library 304 for an interconnect primitive having the key (M2, M1, 0.5, 1, 0.5). Of course, due to fractional occupancies, an exact mapping is often unavailable. In such cases, the closest interconnect primitives are used to interpolate the present configuration. In fact, in the present embodiment, interconnect primitives are provided only for normalized bin values of 0 or 1 (i.e. 0 representing no occupancy in the bin, 1 representing 100% occupancy of the bin). Thus, in the configuration shown in FIG. 5, geometry extractor module 402 chooses a number of bounding interconnect primitives, and interpolates the required capacitance values between these bounding interconnect primitives. For example, the coupling capacitance value for primitives with bin factors (0.5, 1, 1) are interpolated from the capacitance values for primitives having bin factors (0, 1, 1) and (1, 1, 1). In this embodiment, interpolation for the bin furthest away from the line segment being analyzed is interpolated using a function that decreases more rapidly than linearly, e.g. 1/x interpolation, and linear interpolation is used in all other bins.

When multiple interpolations between bin factors are needed, as in the configuration of FIG. 5, the interpolations are performed in increasing dominant factor order. That is, the most dominant factor is always interpolated last. The most dominant bin factor (and hence is always last to be interpolated) is the bin which contains the interconnect primitive for which the capacitance is being calculated. The next dominant factor relates to the distance from the line segment being analyzed: i.e. the further away a bin is from the line segment being analyzed, the lesser the dominant factor. For example, if the bin factors are (0.5, 1, 0.5), as in FIG. 5, the first and third bins (i.e. bins 504 and 506 in FIG. 5) are interpolated. When calculating the capacitances between the line segment being analyzed and the interconnect primitives in bin 504, the bin 506 values are interpolated first. That is, capacitances for (a) bin factors (0, 1, 0.5) and (b) bin factors (1, 1, 0.5) are obtained by interpolating the capacitances under (i) bin factors (0, 1, 0) and (0, 1, 1), and (ii) bin factors (1, 1, 0) and (1, 1, 1). The desired capacitances are then derived by interpolating capacitances of the library primitives for bin factors (0, 1, 0.5) and (1, 1, 0.5) thus obtained. Similarly, when calculating the capacitances between the line segment being analyzed and the interconnect primitives in bin 506, the bin 504 values are interpolated first. That is, capacitances for the primitives for (a) bin factors (0.5, 1, 0) and (b) bin factors (0.5, 1, 1) are first obtained by interpolating the capacitances under (a) bin factors (0, 1, 0) and (1, 1, 0), and (b) bin factors (0, 1, 1) and bin factors (1, 1, 1). The desired capacitances are then derived from the primitives for bin factors (0.5, 1, 0) and (0.5, 1, 1). When calculating the capacitances between the line segment being analyzed and interconnect primitives in bin 505, the interpolation order is based solely on the distance from the line segment being analyzed (because bin 505 does not need interpolating). Therefore, the interpolation order is bin 506 first, then bin 504.

Once the correct combination of bin and layer factors for an interconnect primitive has been calculated, two other factors are used to further identify an interconnect primitive: LBA width (width of the line segment being analyzed), and spacing (distance between the line segment being analyzed and its nearest parallel neighbor on the same conductor layer). Within each combination of bin and layer factors, capacitance values for the different interconnect primitive types are grouped into tables based on different width and spacing values. Note that the capacitance values stored represent the data points on curves relating the coupling capacitance values to width and spacing. A piecewise linear analysis of the curves produce the individual data values that are stored in interconnect primitive library 304. As with bin factors, if specific values for width or spacing are not present in the library, interpolations between values specified by existing width and spacing values are used.

The last parameters used to identify an interconnect primitive are its type and its location relative to the line segment being analyzed (measured in terms of bins). In the present embodiment, the following interconnect primitive types are used:

1. Nearest parallel neighbor in the same conductor layer, which represents the effects of the entire neighbor line. The coupling capacitance to this interconnect primitive is labeled $C_c$.

2. Top plates of polygons in conductor layers below the line segment being analyzed, or bottom plates of polygons in conductor layers above the line segment being analyzed. These interconnect primitives are further broken down according to bins. For the structure illustrated in FIG. 5, top plate 509 would be broken down into three interconnect primitives (since the plate extends into bins 504, 505 and 506). The coupling capacitances to each of these interconnect primitives is labeled $C_g$.

3. Polygon faces that are parallel to the signal direction of the line segment being analyzed, and that are on different conductor layers than the conductor layer of the line segment being analyzed. Faces are further broken down into those faces which face toward the line segment being analyzed and those which face away from the line segment being analyzed. In FIG. 5, face 507 is a "toward face" and face 508 is an "away face". The coupling capacitances to these interconnect primitives are labeled $C_{ft}$ for "toward faces" and $C_{fa}$ for "away faces".

Figure 6:
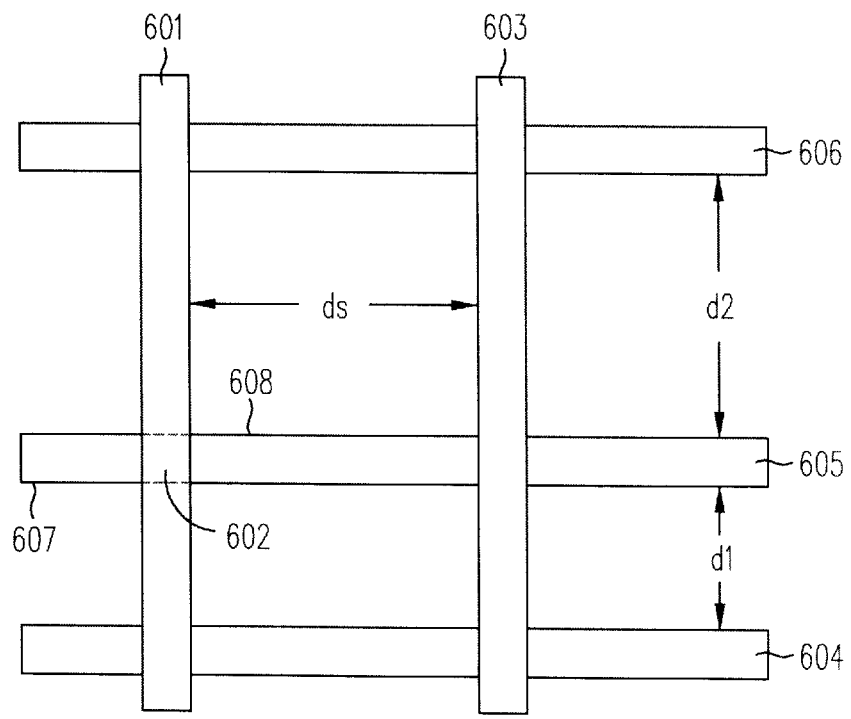
FIG. 6 illustrates a typical configuration for estimating the edge capacitance $C_e$.

4. Polygon faces that are perpendicular to the signal direction of the line segment being analyzed (also called "edges") and that are on different conductor layers from the conductor layer of the line segment being analyzed. As with the interconnect primitive of coupling capacitance $C_g$, edges are further broken down according to bin. For example, in FIG. 5, the edge face 502a is divided into three interconnect primitives (since the plate extends into bins 504, 505 and 506). There is one additional factor used to identify the edge interconnect primitives—distance from the edge to the nearest parallel edge in the same conductor layer. Coupling capacitances to edge interconnect primitives are labeled $C_e$. FIG. 6 illustrates the factors which affect the edge capacitance $C_e$. FIG. 6 shows a line being analyzed 601, which is spaced by a spacing $d_s$ from a parallel line 603 in the same conductor layer as 601. Conductors 601 and 603 are formed above a neighboring conductor layer which includes conductors 604–606. The edge capacitance $C_e$ between the line segment being analyzed in change area 602 and an edge 607 of conductor 605 depends upon the distance $d_1$ between conductors 604 and 605 and the spacing $d_1$ between conductors 601 and 603, but is reasonably independent of the width of conductor 605, the other edge 608 of conductor 605, or the distance d2 (which is greater than $d_1$) between conductors 605 and 606 on the opposite side of edge 607.

The curves of edge capacitance $C_e$ versus distance $d_1$, parameterized by the spacing $d_s$, are roughly the same shape. Thus, sample values at various distance are provided for a given reference spacing (thus, forming a "piecewise" linear curve). The curve for edge capacitance $C_3$ can then be reconstructed at runtime, given the spacing $d_s$. The edge capacitance for each edge of interest at any neighboring spacing $d_1$ can then be read from the reconstructed curve.

5. Substrate. Parasitic extractor 306 assumes that there is a blanket ground plane below all structures. The substrate interconnect primitive is not divided into bins. Capacitance to this ground plane primitive is labeled $C_{sub}$.

Although the present invention and its advantages have been described in detail, it should be understood that various changes, substitutions, and alterations can be made therein without departing from the spirit and scope of the invention as defined by the appended claims.

We claim:

1. A method for analyzing parasitic impedance in a circuit, comprising:

receiving a description of a layout of the circuit;

receiving an identification of a conductor to be analyzed in the circuit;

tracing the conductor to be analyzed using the description of the layout of the circuit;

determining parasitic impedance values including determining an inductance value for the conductor using a parameterized inductance table with pre-computed inductance values; and creating a circuit description for the conductor using the parasitic impedance values, wherein determining the inductance value for the conductor comprises:

analyzing, using the description of the layout of the circuit, structures within a selected distance of the conductor within the circuit;

determining a computed distance from the conductor to a current return path for the conductor; and using the computed distance to the current return path and the parameterized inductance table to determine the inductance value for the conductor.

2. The method of claim 1, wherein determining the parasitic impedance values comprises determining a parasitic capacitance value for the conductor.

3. The method of claim 2, wherein determining the parasitic impedance values further comprises determining a resistance value for the conductor.

4. The method of claim 3, wherein creating the circuit description for the conductor using the parasitic impedance values comprises:

changing at least one of the parasitic capacitance value and the resistance value for the conductor in response to the inductance value; and creating the circuit description for the conductor using the parasitic capacitance value and the resistance value.

5. The method of claim 2, further comprising:

calculating an effective dielectric constant for an environment of the conductor;

calculating a second inductance value for the conductor using the parasitic capacitance value for the conductor, the effective dielectric constant for the environment of the conductor and the speed of light;

comparing the inductance value to the second inductance value; and in response to a determination that the inductance value differs from the second inductance value by more than a preselected difference factor, correcting the inductance value to correspond to the second inductance value.

6. The method of claim 5, wherein the correcting the inductance value to correspond to the second inductance value is carried out when the inductance value differs from the second inductance value by more than 10%.

7. The method of claim 5, wherein the correcting the inductance value to correspond to the second inductance value comprises setting the inductance value equal to the second inductance value.

8. The method of claim 5, wherein the correcting the inductance value to correspond to the second inductance value comprises setting the inductance value equal to an average of the inductance value and the second inductance value.

9. The method of claim 1, further comprising:

receiving a technology profile including values of physical parameters characterizing a plurality of conducting and dielectric layers of the circuit; and creating impedance functions including creating the parameterized inductance table in an interconnect primitive library in response to the technology profile.

10. The method of claim 9, wherein creating the parameterized inductance table in the interconnect primitive library in response to the technology profile comprises:

performing a plurality of inductance calculations for one of the conducting layers of the integrated circuit including the conductor using the physical parameters characterizing the plurality of conducting and dielectric layers from the technology profile, the inductance calculations being performed using a set of difference distances to return path; and storing a set of inductance values resulting from the plurality of inductance calculations in the interconnect primitive library together with the distances to return path corresponding to each inductance value.

11. The method of claim 10, wherein determining the inductance value for the conductor using the parameterized inductance table comprises:

dividing the conductor into a plurality of segments;

for each conductor segment, determining a distance from the conductor segment to a current return path for the conductor segment;

for each conductor segment, deriving an inductance value for the conductor segment using the inductance values stored in the interconnect primitive library based on the distance from the conductor segment to the current return path; and adding together the inductance values for the conductor segments to determine the inductance value for the conductor.

12. The method of claim 11, wherein deriving the inductance value for each conductor segment comprises interpolating between the inductance values stored in the interconnect primitive library using the distance from the conductor segment to the current return path for the conductor segment.

13. The method of claim 1, further comprising receiving an identification of an operating frequency of the circuit, wherein determining the inductance value for the conductor comprises comparing the operating frequency of the circuit to a frequency associated with the parameterized inductance table of the interconnect primitive library.

14. The method of claim 1, further comprising performing a circuit timing simulation using the circuit description for the conductor.

15. The method of claim 1, wherein the pre-computed inductance values in the parameterized inductance table are indexed by parameters comprising an identification of a conductor layer, a conductor width and a conductor spacing.

16. A method for determining a parasitic impedance value for a conductor from an integrated circuit description, comprising:

analyzing structure within a selected distance of the conductor using the integrated circuit description;

determining from the integrated circuit description a computed distance from said conductor to a current return path for the conductor; and calculating an inductance value for the conductor using the computed distance to the current return path and a parameterized inductance table with a set of pre-computed inductance values.

17. The method of claim 16, further comprising calculating a parasitic capacitance value for the conductor.

18. The method of claim 17, further comprising calculating a parasitic resistance value for the conductor.

19. The method of claim 18, further comprising creating a circuit description for the conductor using the inductance value, the parasitic capacitance value and the parasitic resistance value.

20. The method of claim 19, wherein creating the circuit description for the conductor comprises creating an RLC circuit description as a model for the conductor.

21. The method of claim 19, wherein creating the circuit description for the conductor comprises:

changing at least one of the parasitic capacitance value and the parasitic resistance value for the conductor in response to the inductance value; and creating an equivalent RC circuit description as a model for the conductor.

22. The method of claim 17, further comprising:

calculating an effective dielectric constant for an environment of the conductor;

calculating a second inductance value for the conductor using the parasitic capacitance value for the conductor, the effective dielectric constant for the environment of the conductor and the speed of light;

comparing the inductance value to the second inductance value; and in response to a determination that the inductance value differs from the second inductance value by more than a preselected difference factor, correcting the inductance value to correspond to the second inductance value.

23. The method of claim 16, wherein determining the computed distance to the current return path for the conductor comprises receiving an identification of the current return path from a user.

24. The method of claim 16, further comprising:

accessing a technology profile by an interconnect library builder, the technology profile including values of physical parameters characterizing a plurality of conducting and dielectric layers of the integrated circuit; and formulating by the interconnect library builder an inductance function for at least one of the conducting layers including the conductor using the physical parameter values from the technology profile;

wherein calculating the inductance value for the conductor using the computed distance to the current return path comprises using the inductance function for the at least one conducting layer including the conductor to calculate the inductance value for the conductor.

25. The method of claim 24, wherein formulating the inductance function by the interconnect library builder comprises:

determining a plurality of inductance values for at least one of the conducting layers including the conductor using a plurality of different values for at least one conductor parameter; and storing the plurality of inductance values and the plurality of different values for the at least one conductor parameter in an inductance table.

26. The method of claim 24, wherein formulating the inductance function by the interconnect library builder comprises:

determining a plurality of inductance values for at least one of the conducting layers including the conductor using a corresponding plurality of different values for a circuit operating frequency; and storing the plurality of inductance values and the corresponding plurality of different values for the circuit operating frequency in an inductance table.

27. The method of claim 26, wherein calculating the inductance value for the conductor further comprises receiving an actual circuit operating frequency;

comparing the actual circuit operating frequency to the plurality of different values for the circuit operating frequency stored in the inductance table;

calculating the inductance value for the conductor using the plurality of inductance values corresponding to the plurality of different values for the circuit operating frequency stored in the inductance table.

28. The method of claim 16, wherein the pre-computed inductance values in the parameterized inductance table are indexed by parameters comprising an identification of a conductor layer, a conductor width and a conductor spacing.

29. A parasitic extraction system for extracting parasitic impedances of an integrated circuit from a layout description of the integrated circuit, comprising:

an interconnect primitive library including a parameterized inductance table for at least one conducting layer of the integrated circuit; and a parasitic extractor operable to analyze structures within a selected distance of a selected conductor within the integrated circuit using the layout description of the integrated circuit, and operable to determine parasitic inductance values for the selected conductor using the parameterized inductance table of the interconnect primitive library based on computed distance from the selected conductor to a current return path for the selected conductor.

30. The parasitic extraction system of claim 29, further comprising:

a technology profile including values of physical parameters characterizing a plurality of conducting and dielectric layers of the integrated circuit; and an interconnect library builder operable to create the parameterized inductance table of the interconnect primitive library using the technology profile.

31. The method of claim 29, wherein the pre-computed inductance values in the parameterized inductance table are indexed by parameters comprising an identification of a conductor layer, a conductor width and a conductor spacing.

32. The method of claim 29, wherein the pre-computed inductance values parameterized inductance table are indexed to a corresponding plurality of different of a circuit operating frequency.

* * * * *